(12) United States Patent
Wu et al.

(10) Patent No.: US 7,316,496 B2
(45) Date of Patent: Jan. 8, 2008

(54) PLANAR LIGHT SOURCE DEVICE

(75) Inventors: Biing-Seng Wu, Tainan (TW);
Wang-Yang Li, Tainan (TW);
Kuo-Tsun Huang, Tainan (TW);
Chen-Pin Hung, Tainan (TW)

(73) Assignee: Chi Mei Optoelectronics Corp. (TW)

( * ) Notice: Subject to any disclaimer, the term of this patent is extended or adjusted under 35 U.S.C. 154(b) by 0 days.

(21) Appl. No.: 11/475,529

(22) Filed: Jun. 27, 2006

(65) Prior Publication Data
US 2007/0002566 A1 Jan. 4, 2007

(30) Foreign Application Priority Data
Jun. 28, 2005 (TW) .............................. 94121559 A (51) Int. Cl.
*F21V 33/00* (2006.01)

(52) U.S. Cl. ...................... 362/561; 362/555; 362/240; 362/241; 362/249; 362/247; 313/500

(58) Field of Classification Search ........ 362/558–561, 362/237, 240, 241, 249, 245–247, 555; 313/500, 313/113; 257/96
See application file for complete search history.

(56) References Cited

U.S. PATENT DOCUMENTS

| | | | |
|---|---|---|---|
| 4,975,814 A * | 12/1990 | Schairer | 362/240 |
| 6,906,459 B2 * | 6/2005 | Suehiro et al. | 313/512 |
| 2003/0053310 A1 * | 3/2003 | Sommers | 362/231 |

* cited by examiner

*Primary Examiner*—Laura Tso
(74) *Attorney, Agent, or Firm*—Trop, Pruner & Hu, P.C.

(57) ABSTRACT

A planar light source device includes a substrate, a circuit layer and light sources. The substrate is penetrable to visible light and has a radiating surface and a second surface opposite the radiating surface. The circuit layer and the light sources are disposed on the second surface of the substrate, and the light sources are electrically connected to the circuit layer.

41 Claims, 7 Drawing Sheets

PLANAR LIGHT SOURCE DEVICE

CROSS-REFERENCE TO RELATED APPLICATION

This claims priority under 35 U.S.C. § 119 of Taiwan patent application No. 094121559, filed Jun. 28, 2005.

TECHNICAL FIELD

The present invention relates generally to a planar light source device having light sources disposed on a surface of a substrate.

BACKGROUND

With improved and more cost-efficient manufacturing techniques, flat panel displays such as liquid crystal displays (LCDs), organic light-emitting displays (OLEDs) and plasma display panels (PDPs) are now widely available to consumers. An LCD can be generally classified into three types, namely, reflection LCD, transmissive LCD, and transflective LCD. A transmissive or a transflective LCD generally includes an LCD panel and a backlight module. The LCD panel has a liquid crystal layer sandwiched between two transparent substrates. The backlight module provides a light source to illuminate the LCD panel for displaying images.

Figure 1:
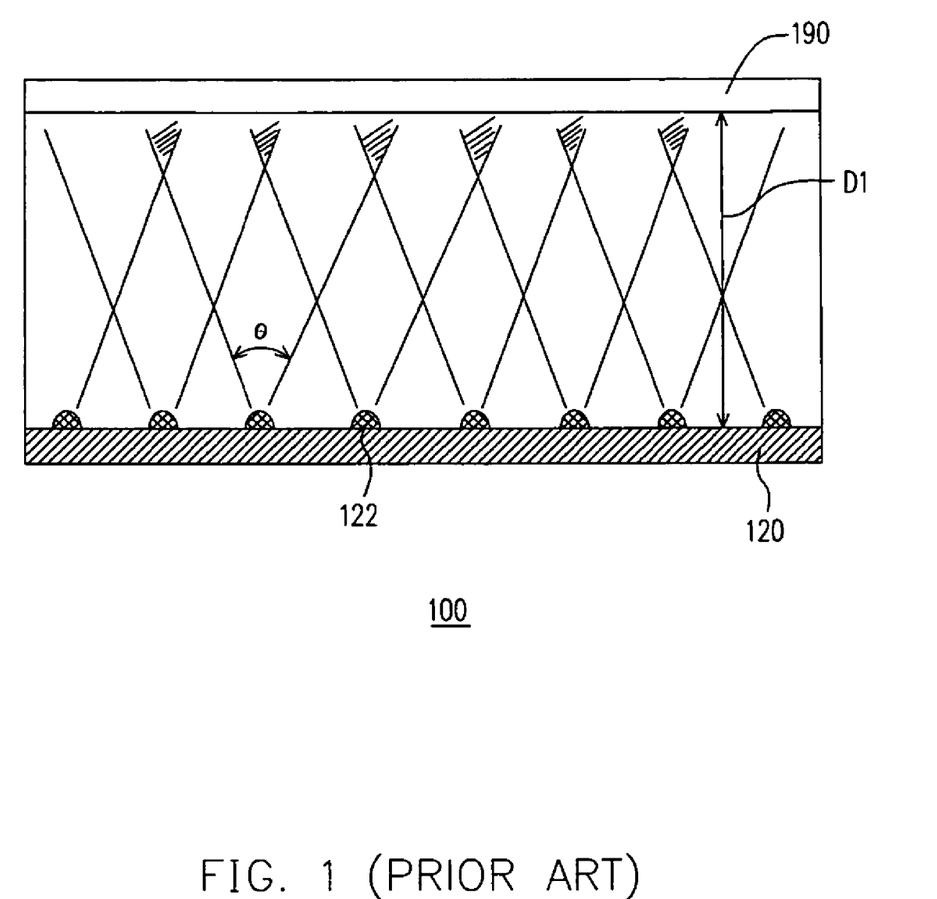
FIG. 1 is a cross-sectional view of a conventional direct-type backlight module.

FIG. 1 is a cross-sectional view showing a conventional direct-type backlight module. The conventional direct-type backlight module 100 includes a light emitting diode (LED) array substrate 120 and a diffusion plate 190. The LED array substrate 120 has a plurality (an array) of LEDs 122, which can emit red light, green light, and blue light. The red light, green light, and blue light are mixed to form white light over the LED array substrate 120. The diffusion plate 190 is disposed over the LED array substrate 120 for diffusing the light.

Because the divergence angles θ of the light emitted from the conventional LEDs 122 are relatively small, a distance D1 is maintained between the diffusion plate 190 and the LED array substrate 120 to allow sufficient mixing of light of various colors emitted by the LEDs 122 such that uniform white light can be provided by the direct-type backlight module 100. The required distance D1 between the LED array substrate and the diffusion plate prevents reduction of the thickness of conventional direct-type backlight modules, which may limit the ability to achieve very slim LCD devices.

DETAILED DESCRIPTION

In the following description, numerous details are set forth to provide an understanding of the present invention. However, it will be understood by those skilled in the art that the present invention may be practiced without these details and that numerous variations or modifications from the described embodiments are possible.

In accordance with some embodiments, a planar light source device having reduced thickness (as compared to conventional light source devices) is provided. The planar light source device includes a substrate, a circuit layer and a plurality (e.g., array) of discrete light sources. The substrate is translucent or transparent such that visible light can penetrate through the substrate. The substrate has a radiating surface and a second surface opposite to the radiating surface; in other words, the radiating surface and second surface are on opposite sides (e.g., top side and bottom side) of the substrate. The circuit layer is disposed on the second surface of the substrate. The discrete light sources are also disposed on the second surface of the substrate and are electrically connected to the circuit layer.

Figure 2:
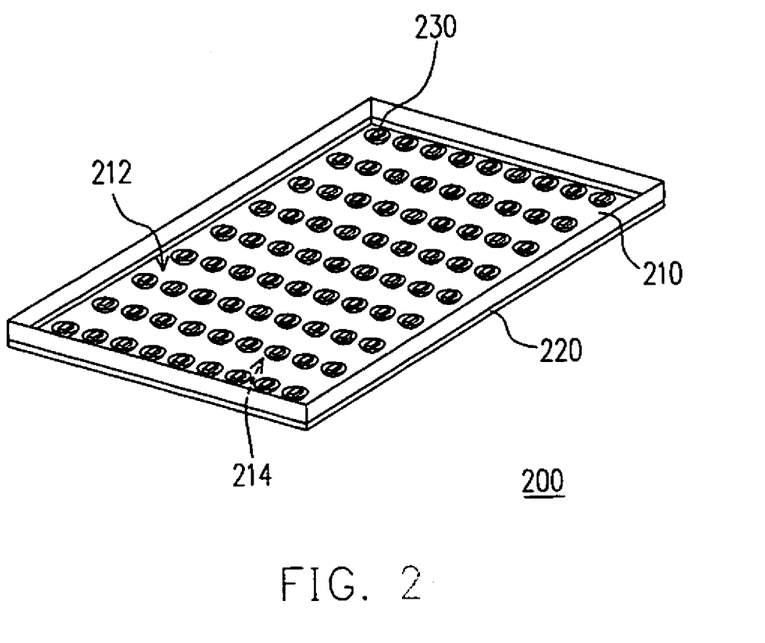
FIG. 2 is an exemplary diagram of a planar light source device according to an embodiment of the invention.

FIG. 2 illustrates an exemplary planar light source device 200 in accordance with some embodiments of the invention, and FIGS. 3A-3I are partial cross-sectional views of the planar light source device to illustrate fabrication of the planar light source device, in accordance with an embodiment. Only one discrete light source and the surrounding portion of the substrate of the planar light source device are depicted in FIGS. 3A-3I.

Referring to FIG. 2, the planar light source device 200 includes a substrate 210, a circuit layer 220 and a plurality of discrete light sources 230 (arranged in an array). In one example implementation, the discrete light sources are light emitting diodes (LEDs). In other implementations, other types of light sources can be used. Generally, a "discrete light source" refers to a light source that is separate and distinct from another light source on the substrate.

The substrate 210 is translucent or transparent to allow visible light to penetrate through the substrate 210. The substrate 210 has a radiating surface 212 and a lower surface 214 opposite to the radiating surface 212. The term "lower" is used merely as a label to indicate that the surface 214 faces in a lower direction in certain orientations of the planar light source device 200. In other orientations, the lower surface 214 can actually face upwardly (as in FIG. 2) or in some other direction. More generally, the lower surface 214 can be referred to as a "second surface" of the substrate 210.

The substrate 210 can either be a light diffusion plate (which diffuses light) or a transparent substrate. Moreover, the material of the substrate 210 can be polymethyl methacrylate (PMMA) or other suitable material.

The circuit layer 220 is disposed on the lower surface 214 of the substrate 210. The circuit layer 220 is designed based on the positions of the discrete light sources 230. The circuit layer 220 has electrical structures that are designed to deliver electrical power to respective discrete light sources 230.

The discrete light sources 230 are also disposed on the lower surface 214 of the substrate 210. The light sources 230 are electrically connected to the circuit layer 220 such that the circuit layer 220 can provide power to the discrete light sources 230 for emitting light. The positions of the discrete light sources 230 can be arranged for obtaining more uniform planar light source. In one implementation, each of the discrete light sources 230 emits white light. Alternatively, the discrete light sources 230 can include red light, green light, and blue light sources, or light sources of other monochromatic colors. Other light sources 230 can produce other color light suitable to be mixed with white light, or other color light suitable to be mixed with another color light. Meanwhile, the light sources 230 of different colors can be positioned separately, or light sources 230 of different colors can be positioned together.

As noted above, both the circuit layer 220 and light sources 230 are disposed on the lower surface 214 of the substrate. The term "disposed on" refers to either directly on or indirectly on. In other words, the circuit layer 220 or light sources 230 being disposed on the lower surface 214 of the substrate means that the circuit layer 220 or lights sources can be directly mounted on the lower surface 214, or mounted on another structure (or structures) which are on the lower surface 214.

Figure 3A:
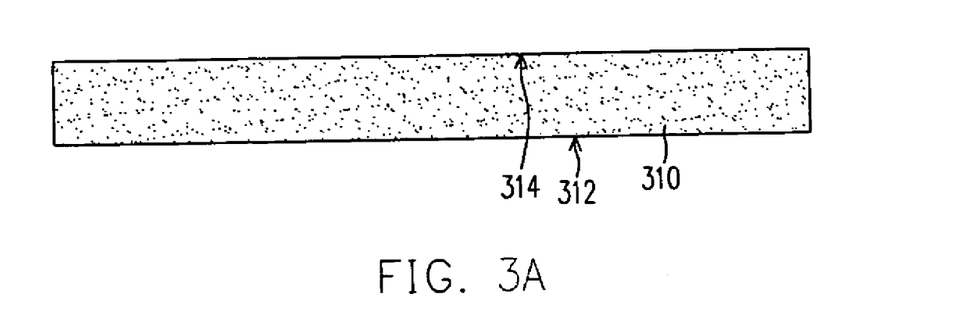
FIGS. 3A-3I are partial cross-sectional views of the planar light source device of FIG. 2 at different stages of fabrication, in accordance with an embodiment.

The following describes a technique for fabricating the planar light source device according to some embodiments. Referring to FIG. 3A, a substrate 310 is provided, where the substrate 310 is identical to the substrate 210 of FIG. 2. The substrate 310 has a radiating surface 312 and a lower surface 314 opposite to the radiating surface 312.

Figure 3B:
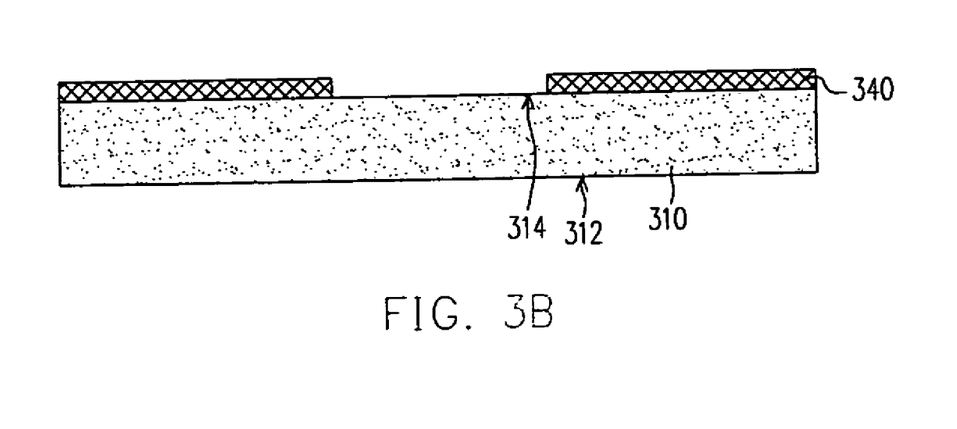

In FIG. 3B, an optional insulating layer 340 is disposed on the lower surface 314 of the substrate 310. The insulating layer 340 can be a light reflective layer that is able to reflect light. The insulating layer 340 can be disposed on the substrate, such as by using a stencil printing technique or by some other technique. The material of the insulating layer 340 can be titanium oxide (TiO$_2$) or other insulating material. The material of the insulating layer 340 can have relatively high heat conductivity.

Figure 3C:
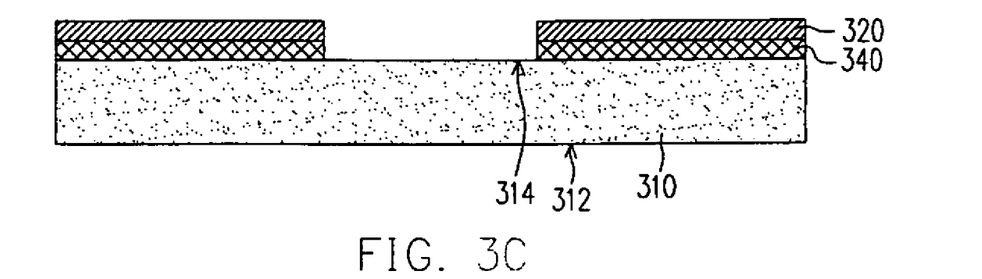

Next, as depicted in FIG. 3C, a circuit layer 320 is disposed on the lower surface 314 of the substrate 310. If the insulating layer 340 was already disposed on the substrate, then the circuit layer 320 is disposed on the insulating layer 340. The circuit layer 320 is formed of an electrically conductive material, such as metal, which has a relatively high electrical conductivity. Alternatively, the circuit layer 320 can be formed of a transparent material that is electrically conductive, such as indium tin oxide (ITO). The circuit layer 320 can be disposed on the substrate or insulating layer using a printing or other technique. As noted above, the insulating layer 340 is light reflective. The presence of the light reflective insulating layer prevents high brightness occurring in the planar light source device if the circuit layer 320 is also reflective, so the planar light source device can be made more uniform. If the insulating layer 340 is light reflective, the insulating layer 340 should be formed away from the light sources 330 disposed later (shown in FIG. 3E) to ensure that light emitted form the light sources 330 will enter the substrate 310 through the lower surface 314.

Figure 3D:
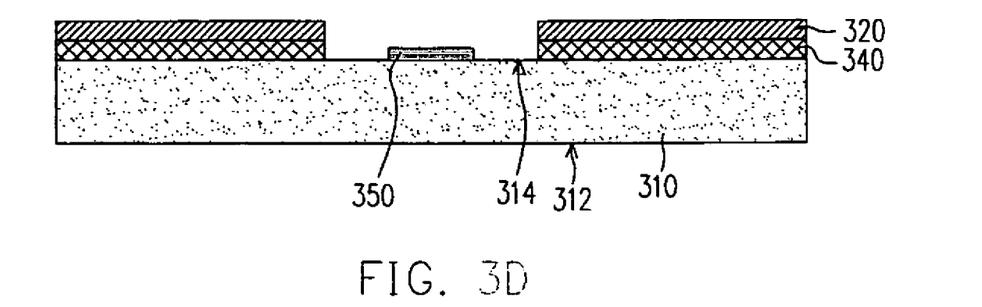

In FIG. 3D, an adhesion layer 350 is optionally disposed on the lower surface 314 of the substrate 310. The adhesion layer can be disposed on the substrate before or after disposing the circuit layer 320 but before disposing the light sources 330 (shown in FIG. 3E).

Figure 3E:
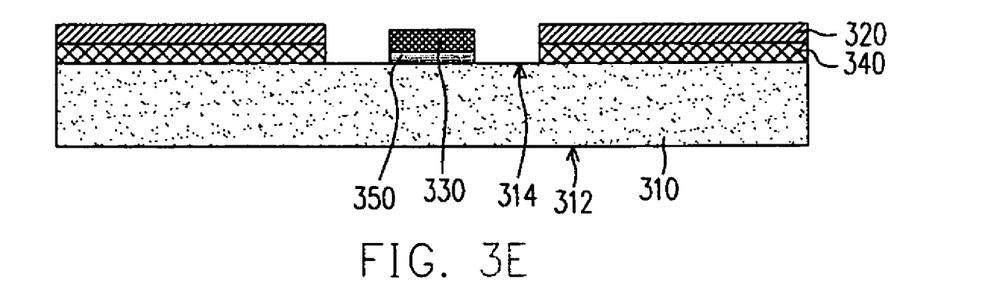

In FIG. 3E, a plurality of light sources 330 (which are the same as light sources 230 in FIG. 2) are disposed on the lower surface 314 of the substrate 310. The light sources 330 are fixed to the lower surface 314 of the substrate 310 by respective adhesion layers 350. As shown in FIG. 3E, the insulating layer 340 has an opening in which the corresponding light source 330 can be located. The opening in the insulating layer 340 allows the insulating layer 340 to be formed away from the light source 330.

Figure 3F:
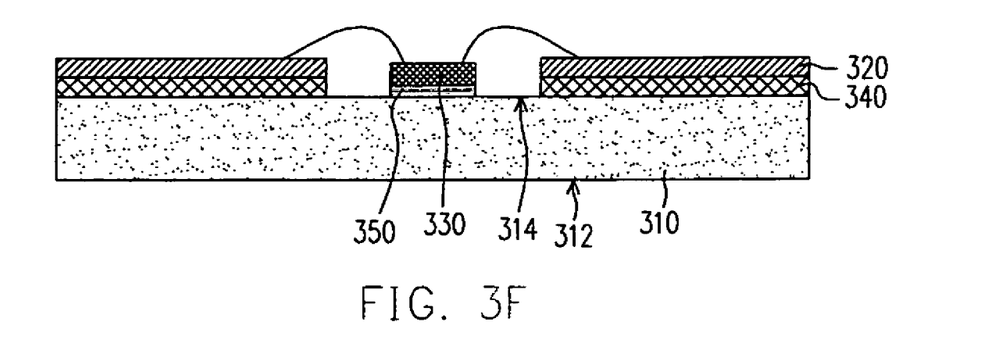

In FIG. 3F, the light sources 330 are electrically connected to the circuit layer 320, such as by using wire bonding. Alternatively, the light sources 330 can also be electrically connected to the circuit layer 320 by using a flip-chip bonding or some other suitable technique.

Figure 3G:
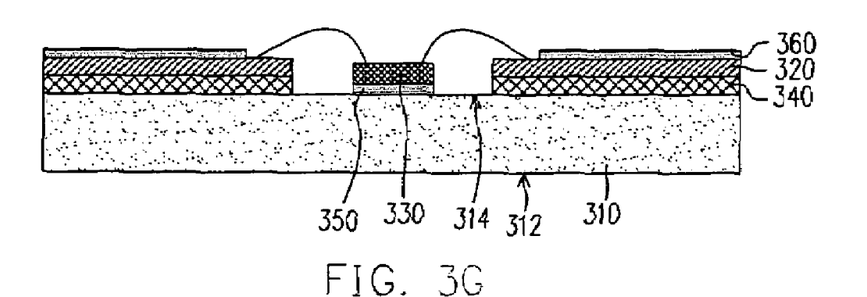
Figure 3H:
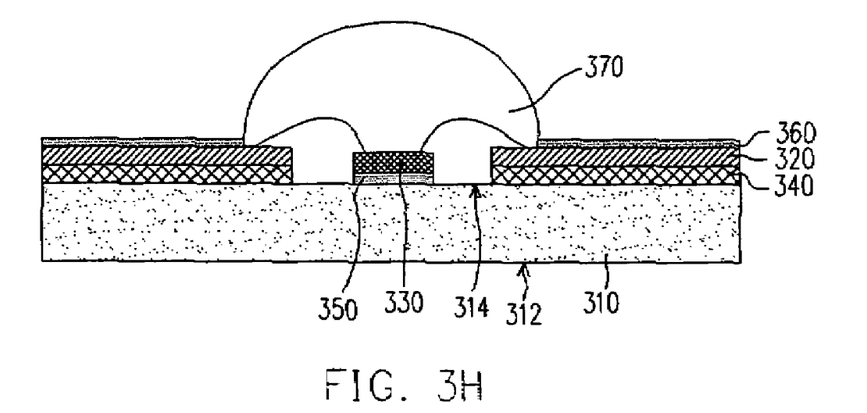

In FIG. 3G, the circuit layer 320 is optionally covered with an insulating layer 360. Next, as shown in FIG. 3H, after electrically connecting the light sources 330 and the circuit layer 320, a plurality of molding compounds 370 (only one shown in FIG. 3H) are formed on the lower surface 314 of the substrate 310, where the molding compounds 370 cover the light sources 330 and the electrical connections (e.g., wires, bumps, etc.) between the light sources 330 and the circuit layer 320. The molding compounds 370 are used to protect the light sources 330 and the electrical connections between the light sources 330 and the circuit layer 320.

In one example, to form the molding compounds 370, a mold (not shown) covers the lower surface 314 of the substrate 310 first for forming a plurality of mold spaces between the mold and the substrate 310. The molding compounds 370 are formed in the mold spaces. Note that the light sources 330 are also located in the mold spaces. Thereafter, each mold space is filled with a molding material. Afterward, the molding material is cured by baking or some other method to form the molding compounds 370. The material of the molding compounds 370 can be epoxy resin or other suitable material.

Figure 3I:
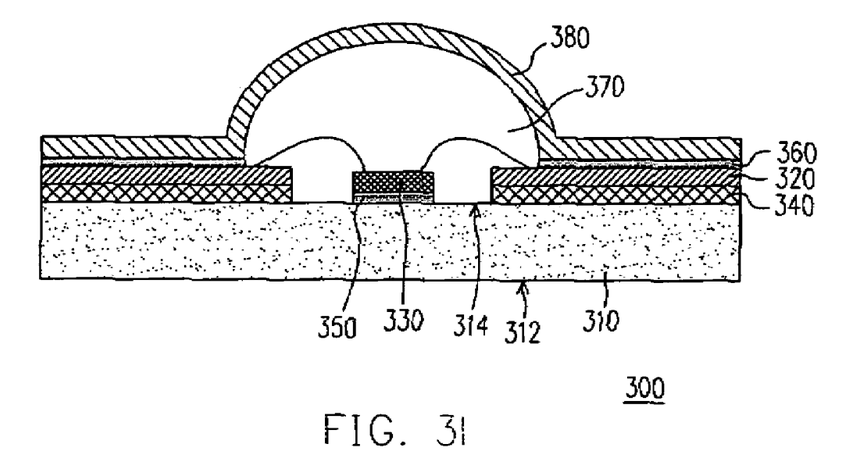

Referring to FIG. 3I, after forming the molding compounds 370, a reflecting sheet 380 optionally can be disposed on the lower surface 314 of the substrate 310, such that the circuit layer 320 and the molding compounds 370 are covered with the reflecting sheet 380. The material of the reflecting sheet 380 can be aluminum, silver, copper or other metal, or any other material with good light reflectivity. Furthermore, there is no gap between the reflecting sheet 380 and the molding compounds 370. To ensure that the entirety of the surfaces of the molding compounds 370 is completely covered with the reflecting sheet 380, the molding spaces for accommodating the molding compounds 370 can be reserved by punching (or otherwise forming an opening in) the reflecting sheet 380 while fabricating the reflecting sheet 380. At this stage, a substantially complete portion of the planar light source device 300 has been formed.

Note that the reflecting sheet 380 in FIG. 3I is a single large sheet that covers substantially the entire lower surface 314 of the substrate. Alternatively, the reflecting sheet 380 can be divided into a plurality of smaller reflecting sheets (not shown), wherein the smaller reflecting sheets cover respective molding compounds 370. As yet another alternative, a reflective material layer (not shown) can be substituted for the reflecting sheet 380, which reflective material layer can merely cover the molding compounds 370 or further cover the circuit layer 320. A reflecting layer differs from a reflecting sheet in that the reflecting layer is coated to the underlying structure(s), such as a coating of white lacquer or other suitable material.

In another embodiment, if the molding compounds 370 are not present, a reflecting sheet (not shown) optionally can be disposed on the lower surface 314 of the substrate 310 after electrically connecting the light sources 330 and the circuit layer 320. The circuit layer 320 and the light sources 330 not covered by the molding compounds 370 are positioned between reflecting sheet and the substrate 310. In a further embodiment, a reflective material layer (not shown) instead of the reflecting sheet can be formed to cover the circuit layer 320 (without use of the molding compounds).

FIGS. 4-8 illustrate partial cross-sectional views of several embodiments of the planar light source device. The differences between the several embodiments are due to the arrangements of reflecting sheets, the shapes of molding compounds, and surface topology of the substrate.

Figure 4:
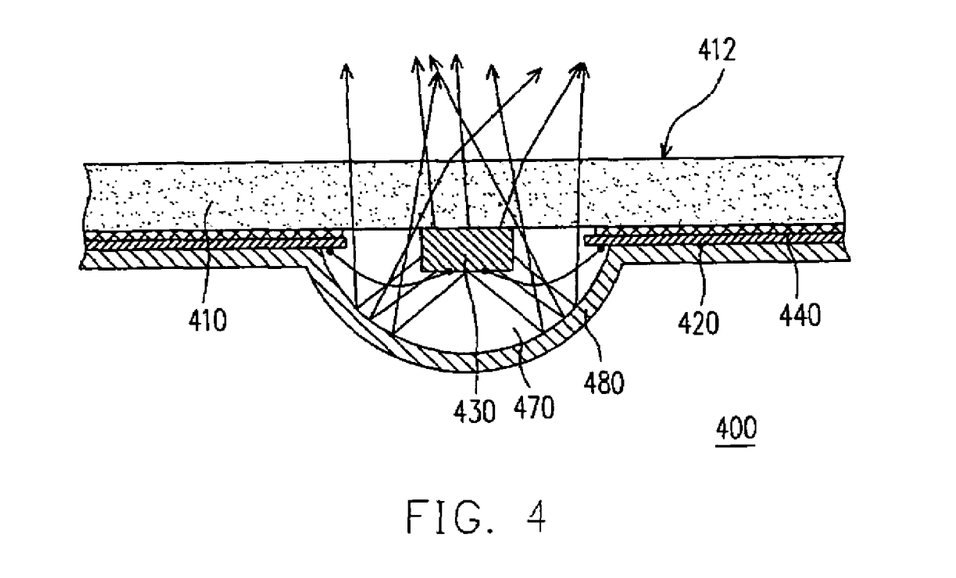
FIGS. 4-8 are partial cross-sectional views of several embodiments of the planar light source device.

Referring to FIG. 4, a planar light source device 400 is similar to the planar light source device 300 in FIG. 3I, but the insulating layer 360 and the adhesion layer 350 in FIG. 3I are not shown. As shown in FIG. 4, the light sources 430 are driven by power transferred from the circuit layer 420 during operation of the planar light source device 400. The light emitted from the light sources 430 can directly enter the substrate 410 or enter the substrate 410 after being reflected by the reflecting sheet 480. Light enters the substrate 410 through the lower surface of the substrate. Meanwhile, the light entering the substrate 410 can be radiated out from the radiating surface 412 after diffusion by the substrate 410. Alternatively, the light entering the substrate can be radiated out from the radiating surface 412 without diffusion by the substrate 410 (if the substrate is transparent). In this manner, the light emitted from the light sources 430 can be transformed into a planar light source with enhanced brightness and uniformity when radiated out from the radiating surface 412 of the substrate 410. In some implementations, optical films such as a diffusion film, a prism film, a light enhancing film, and so forth, can be disposed on the radiating surface 412 of the substrate 410 for improving brightness and uniformity of the light source provided by the planar light source device 400.

The shape of the molding compounds 470 depicted in FIG. 4 is generally hemispheric. In alternative implementations, the shape of the molding compounds 470 can be conical, pyramid, or some other shape. The shape of the molding compounds 470 is selected to increase the light efficiency. As further depicted in FIG. 4, the circuit layer 420 and the molding compounds 470 are covered with the reflecting sheet 480.

Figure 5:
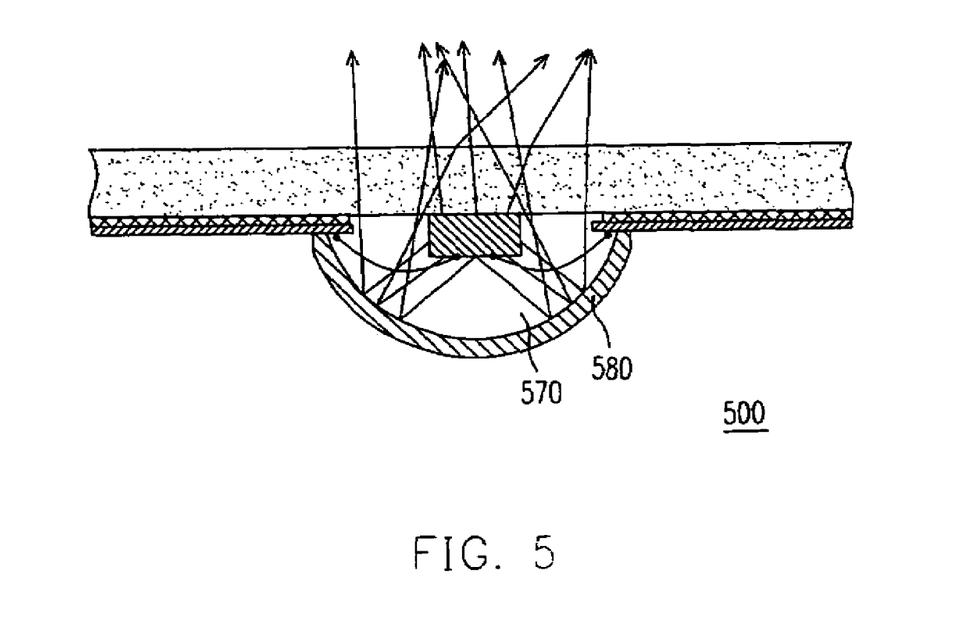

Unlike the planar light source device 400 in FIG. 4, the planar light source device 500 of FIG. 5 has molding compounds 570 that are covered with a plurality of individual reflecting sheets 580, respectively, rather than the single reflecting sheet 480 of FIG. 4. Alternatively, multiple individual reflective material layers can be substituted for the reflecting sheets 580, with the reflective material layers formed by sputtering or other suitable method.

Figure 6:
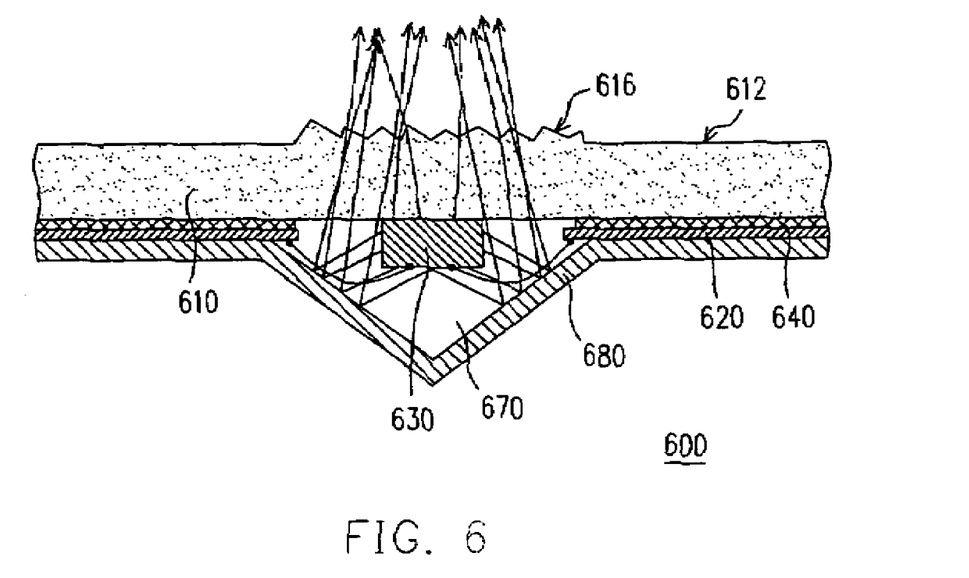

Referring to FIG. 6, a planar light source device 600 has molding compounds 670 that have a cone or pyramid shape. Also, a radiating surface 612 of the substrate 610 of the planar light source device 600 has a plurality of rough structures 616. The positions of the rough structures 616 correspond to positions of respective light sources 630. The rough structures 616 are used to scatter light passing through the substrate to reduce brightness across the light source device 600. The planar light source device 600 has a single reflecting sheet 680 that covers the entire array of molding compounds 670. Note also that the planar device 600 has a circuit layer 620 and an insulating layer 640.

Figure 7:
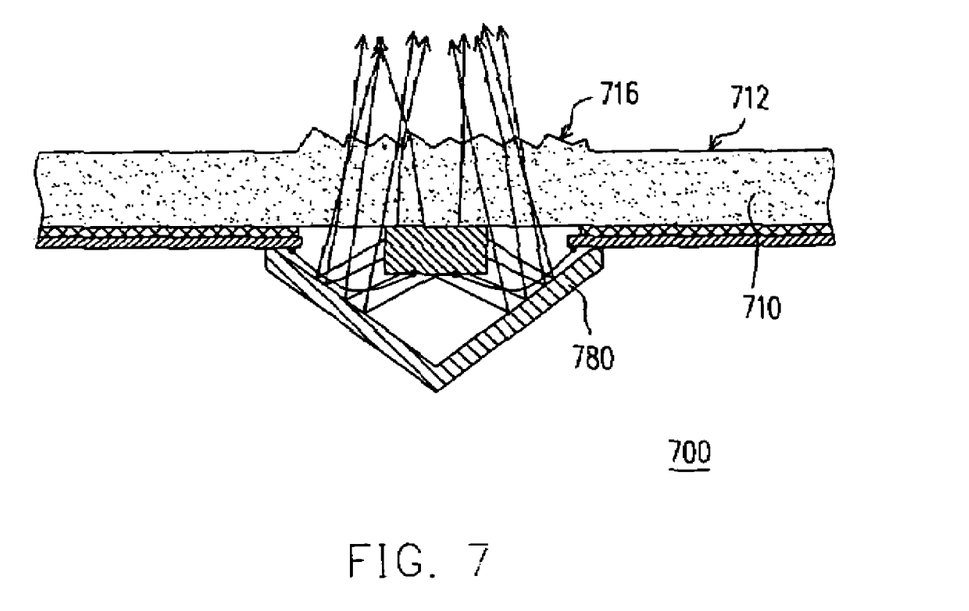

Referring to FIG. 7, a planar light source device 700 according to another embodiment is similar to the planar light source device 600 of FIG. 6, except that the light source device 700 has individual reflecting sheets 780 rather than a single reflecting sheeting 680. The planar light source device 700 further includes a substrate 710, radiating surface 712, and rough structures 716 to scatter light.

Figure 8:
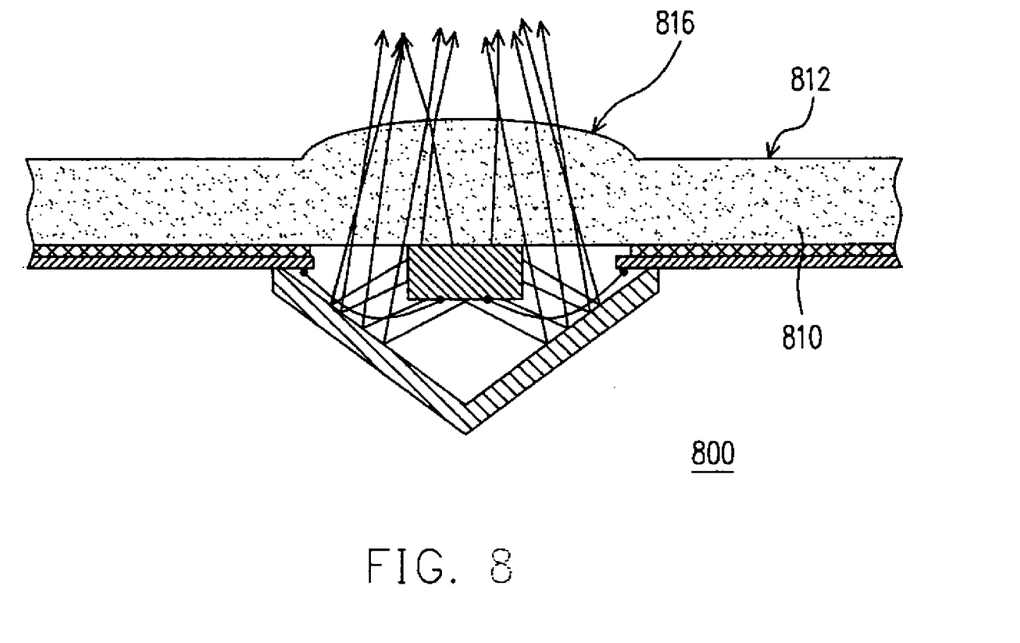

Referring to FIG. 8, a planar light source device 800 according to a further embodiment is similar to the planar light source device 700 of FIG. 7 except that lens structures 816 are provided on the radiating surface 812 of the substrate 810 instead of rough structures 716 in FIG. 7. The lens structures 816 are positioned to correspond to respective light sources to allow refraction of light from such light sources by the lens structures 816. Alternatively, other types of micro-structures can be used instead of the lens structures 816 in FIG. 8 or the rough structures 716 in FIG. 7 for improving brightness and uniformity of the planar light source device.

Figure 9:
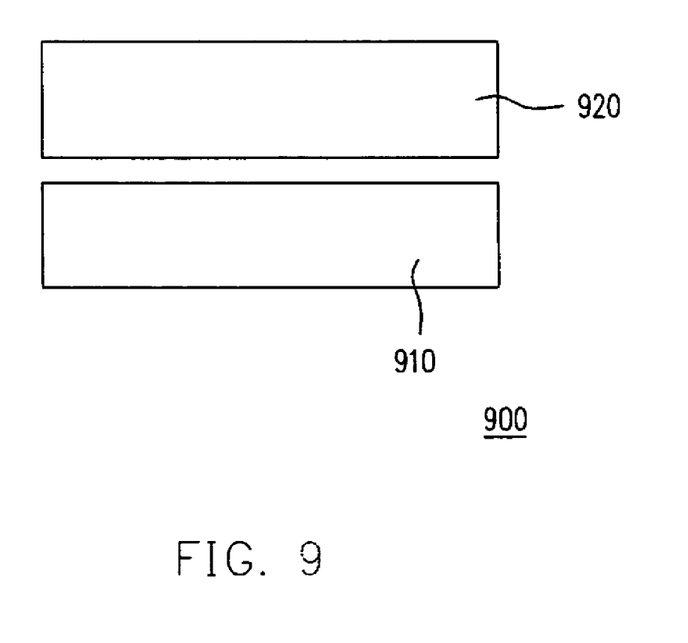
FIG. 9 is an exemplary diagram of a liquid crystal display that includes a planar light source device according to an embodiment.

FIG. 9 illustrates an exemplary diagram of a liquid crystal display 900 according to some embodiments. The liquid crystal display 900 includes a planar light source device 910 (any of the planar light source device described above) and a liquid crystal display panel 920. The liquid crystal display panel 920 is disposed over (or otherwise adjacent) the radiating surface of the planar light source device 910.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A planar light source device, comprising:
   a substrate through which visible light can penetrate, the substrate having a radiating surface and a second surface opposite to the radiating surface;
   a circuit layer disposed on the second surface of the substrate;
   a plurality of light sources disposed on the second surface of the substrate and electrically connected to the circuit layer; and
   a light reflective insulating layer disposed between the circuit layer and the second surface of the substrate,
   wherein the light reflective insulating layer defines openings to allow light from the respective light sources to pass to the substrate.

2. The planar light source device of claim 1, wherein the light sources are arranged such that light emitted by the light sources pass through the substrate and is radiated by the radiating surface.

3. The planar light source device of claim 1, wherein the insulating layer is formed of titanium oxide.

4. The planar light source device of claim 1, further comprising adhesion layers disposed between the second surface of the substrate and corresponding light sources.

5. The planar light source device of claim 1, further comprising a second insulating layer disposed on the second surface of the substrate and covering the circuit layer.

6. The planar light source device of claim 1, further comprising a plurality of molding compounds disposed on the second surface of the substrate and covering respective light sources and electrical connections between the light sources and the circuit layer.

7. The planar light source device of claim 6, wherein the molding compounds are formed of epoxy resin.

8. The planar light source device of claim 6, further comprising a single light reflecting sheet disposed on the second surface of the substrate to cover plural of the plurality of light sources, wherein the circuit layer and the molding compounds are positioned between the light reflecting sheet and the substrate.

9. The planar light source device of claim 8, wherein all surfaces of the molding compounds are completely covered with the light reflecting sheet.

10. The planar light source device of claim 6, further comprising a plurality of light reflecting sheets disposed on respective molding compounds.

11. The planar light source device of claim 10, wherein all surfaces of the molding compounds are completely covered with the light reflecting sheets.

12. The planar light source device of claim 6, further comprising a light reflective layer covering the molding compounds, wherein the light reflective layer is a coating on the molding compounds.

13. The planar light source device of claim 12, wherein the light reflective material layer further covers the circuit layer.

14. The planar light source device of claim 6, wherein each of the molding compounds has one of a cone shape and a pyramid shape.

15. The planar light source device of claim 1, further comprising a single light reflecting sheet disposed on the second surface of the substrate to cover plural of the plurality of light sources, wherein the circuit layer and the plural light sources are positioned between the light reflecting sheet and the substrate.

16. A planar light source device, comprising:
a substrate through which visible light can penetrate, the substrate having a radiating surface and a second surface opposite to the radiating surface;
a circuit layer disposed on the second surface of the substrate; and
a plurality of light sources disposed on the second surface of the substrate and electrically connected to the circuit layer,
wherein the substrate has rough structures on the radiating surface, and wherein the rough structures are located at positions correspondingly to the light sources for scattering light from the respective light sources.

17. A planar light source device, comprising:
a substrate through which visible light can penetrate, the substrate having a radiating surface and a second surface opposite to the radiating surface;
a circuit layer disposed on the second surface of the substrate; and
a plurality of light sources disposed on the second surface of the substrate and electrically connected to the circuit layer,
wherein the substrate has a plurality of lens structures on the radiating surface, and wherein the lens structures are located at positions corresponding to the light sources to refract light from the respective light sources.

18. The planar light source device of claim 17, wherein the light sources comprise light emitting diodes.

19. The planar light source device of claim 17, wherein the substrate comprises a light diffusion plate.

20. The planar light source device of claim 17, wherein the substrate is formed of polymethyl methacrylate (PMMA).

21. The planar light source device of claim 17, wherein the substrate is transparent.

22. A liquid crystal display, comprising:
a planar light source device, comprising:
a substrate that is penetrable by visible light, the substrate having a radiating surface and a second surface opposite to the radiating surface;
a circuit layer disposed on the second surface of the substrate, the circuit layer having electrically conductive structures; and
a plurality of light sources disposed on the second surface of the substrate and electrically connected to the circuit layer; and
a liquid crystal display panel disposed adjacent the radiating surface of the substrate.

23. The liquid crystal display of claim 22, wherein the planar light source device further comprises a light reflective insulating layer disposed between the circuit layer and the second surface of the substrate, and wherein the insulating layer has openings to allow light from the light sources to pass through the substrates to the radiating surface.

24. The liquid crystal display of claim 22, wherein light from the light sources pass through the substrate to the radiating surface.

25. The liquid crystal display of claim 22, wherein the planar light source device further comprises adhesion layers disposed between the second surface of the substrate and respective light sources.

26. The liquid crystal display of claim 22, wherein the planar light source device further comprises a plurality of molding compounds disposed on the second surface of the substrate and covering respective light sources and electrical connections between the light sources and the circuit layer.

27. The liquid crystal display of claim 26, wherein the planar light source device further comprises a single light reflecting sheet disposed on the second surface of the substrate, and wherein the circuit layer and the molding compounds are positioned between the light reflecting sheet and the substrate.

28. The liquid crystal display of claim 26, wherein the planar light source device further comprises a plurality of light reflecting sheets disposed on respective molding compounds.

29. The liquid crystal display of claim 22, wherein the planar light source device further comprises a single light reflecting sheet disposed on the second surface of the substrate, and wherein the circuit layer and the light sources are positioned between the light reflecting sheet and the substrate.

30. The liquid crystal display of claim 22, wherein the substrate has structures on the radiating surface located at positions corresponding to the light sources to scatter or refract light from respective light sources.

31. The liquid crystal display of claim 22, wherein the light sources comprise light emitting diodes.

32. The liquid crystal display of claim 22, wherein the substrate comprises a light diffusion plate.

33. A method of fabricating a liquid crystal display device, comprising:
providing a planar light source that is formed by:
providing a substrate that is penetrable by visible light and that has a radiating surface and a second surface on a side of the substrate opposite the radiating surface;
disposing a circuit layer on the second surface of the substrate;
disposing a plurality of light sources on the second surface of the substrate;
electrically connecting the light sources and the circuit layer; and
disposing a liquid crystal display panel adjacent the planar light source to enable the liquid crystal display panel to receive light emitted from the radiating surface of the planar light source.

34. The method of claim 33, wherein electrically connecting the light sources and the circuit layer comprises electrically connecting using one of wire bonding and flip-chip bonding.

35. The method of claim 33, wherein providing the planar light source comprises providing the planar light source that has a light reflective insulating layer disposed on the second surface between the substrate and the circuit layer, and wherein the insulating layer has openings corresponding to respective light sources to allow light from the light sources to pass to the substrate.

36. The method of claim 33, wherein providing the planar light source comprises providing the planar light source that has adhesion layers between the second surface of the substrate and the light sources.

37. The method of claim 33, wherein providing the planar light source comprises providing the planar light source that has a plurality of molding compounds on the second surface of the substrate and covering the light sources and electrical connections between the light sources and the circuit layer.

38. The method of claim 37, wherein providing the planar light source comprises providing the planar light source having a single light reflecting sheet disposed on the second surface of the substrate wherein the circuit layer and the molding compounds are positioned between the light reflecting sheet and the substrate.

39. The method of claim 37, wherein providing the planar light source comprises providing the planar light source that has a plurality of light reflecting sheets disposed on the molding compounds.

40. The method of claim 33, wherein disposing the plurality of light sources comprises arranging the light sources to allow light from the light sources to pass through the substrate and to emit from the radiating surface.

41. The liquid crystal display of claim 22, wherein the substrate has a plurality of lens structures disposed on the radiating surface, and wherein the lens structures are located at positions corresponding to the light sources to refract light from the corresponding light sources.

* * * * *